United States Patent
Liu et al.

(10) Patent No.: US 7,247,895 B2
(45) Date of Patent: Jul. 24, 2007

(54) ELECTROSTATIC NANOLITHOGRAPHY PROBE ACTUATION DEVICE AND METHOD

(75) Inventors: Chang Liu, Champaign, IL (US); David Andrew Bullen, Pittsburg, PA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 11/377,629

(22) Filed: Mar. 16, 2006

(65) Prior Publication Data

US 2006/0228873 A1 Oct. 12, 2006

Related U.S. Application Data

(60) Continuation-in-part of application No. 11/073,938, filed on Mar. 7, 2005, which is a continuation of application No. 10/647,724, filed on Aug. 25, 2003, now Pat. No. 6,867,443, which is a division of application No. 10/008,719, filed on Dec. 7, 2001, now Pat. No. 6,642,129.

(60) Provisional application No. 60/307,976, filed on Jul. 26, 2001.

(51) Int. Cl.
   *H01L 27/148* (2006.01)
   *H01L 29/768* (2006.01)

(52) U.S. Cl. ..................... 257/226; 257/444

(58) Field of Classification Search ................ 257/226, 257/234, 235, 431, 440, 444
   See application file for complete search history.

(56) References Cited

U.S. PATENT DOCUMENTS

| | | | |
|---|---|---|---|
| 5,363,697 A | 11/1994 | Nakagawa | |
| 5,372,930 A | 12/1994 | Colton et al. | |
| 5,666,190 A | 9/1997 | Quate et al. | |
| 5,696,491 A | 12/1997 | White et al. | |
| 5,835,477 A | 11/1998 | Binnig et al. | |
| 5,866,807 A | 2/1999 | Elings et al. | |
| 6,136,208 A | 10/2000 | Chou et al. | |
| 6,189,374 B1 | 2/2001 | Addertin et al. | |

(Continued)

OTHER PUBLICATIONS

Seunghun Hong, C.A. Mirkin, "A nanoplotter with both parallel and serial writing capabilities", Science, vol. 288, No. 5472, pp. 1808-1811, Jun. 9, 2000.

(Continued)

*Primary Examiner*—Phuc T. Dang
(74) *Attorney, Agent, or Firm*—Foley & Lardner LLP

(57) ABSTRACT

Method and apparatus for selectively actuating a cantilevered probe for applying a compound to a substrate in nanolithography. A probe having a probe electrode and a substrate having a counter electrode are provided. Voltage applied to the probe electrode and/or counter electrode provides electrostatic attraction between them, moving a probe tip into sufficient proximity to the substrate to apply the patterning compound. Alternatively, a flexible cantilevered probe anchored to a holder includes a layer of conductive material forming a probe electrode. A counter electrode on the holder faces the probe electrode. The holder and probe are positioned so that a probe tip applies the compound to the substrate. The probe is disposed between the substrate and the counter electrode. An electrostatic attractive force generated between the probe electrode and the counter electrode flexes the probe and lifts the tip away from the substrate to suspend writing.

34 Claims, 12 Drawing Sheets

U.S. PATENT DOCUMENTS

| | | |
|---|---|---|
| 6,218,086 B1 | 4/2001 | Binnig et al. |
| 6,416,476 B1 | 7/2002 | Ogasawara et al. |
| 6,507,478 B1 | 1/2003 | Sameshima |
| 6,827,979 B2 * | 12/2004 | Mirkin et al. ............... 427/256 |
| 6,862,921 B2 * | 3/2005 | Chand et al. ................ 73/105 |
| 2001/0038598 A1 | 11/2001 | Despont et al. |

OTHER PUBLICATIONS

Jin Zhu, "Chemical and physical methods for the modification of high-temperature superconductors, nanoparticles and other inorganic substrates (Abstract)", The Sciences and Engineering, vol. 60-12B, pp. 6102, 1999.

Dana A. Weinberger, Seunghun Hong, Chad A. Mirkin, B.W. Wessels, Thomas B. Higgins, "Combinatorial generation and analysis of nanometer-and micrometer-scale silicon features via 'dip-pen' nanolithography and wet chemical etching", Advanced Materials, vol. 12, No. 21, pp. 1600-1603, Nov. 2000.

R.D. Piner, Jin Zhu, Feng Xu, Seunghun Hong, C.A. Mirkin," "Dip-Pen" nanolithography", Science, vol. 283, No. 5402, pp. 661-663, Jan. 29, 1999.

Chad A. Mirkin, "DNA-based Methodology for Preparing Nanocluster Circuits, Arrays, and Diagnostic Materials", MRS Bulletin, vol. 25, No. 1, pp. 43-54, 2000.

Michael Gross, "Incredible nanoplotter", Chemistry in Britain, vol. 36, No. 10, p. 25, Oct. 2000.

S. Hong, J. Zhu, C.A. Mirkin, "Multiple ink nanolithography: toward a multiple-pen nano-plotter", Science, vol. 286, No. 5439, pp. 523-525, Oct. 15, 1999.

David Rotman, "Nanotech Goes to Work (Technology Information)", Technology Review (Cambridge, Mass.), vol. 104, No. 1, pp. 62-68, Jan. 1, 2001.

Ming Zhang, David Bullen, Kee S. Ryu, Chang Liu, (University of Illinois at Urbana-Champaign), Seunghun Hong, Sung-Wook Chung, and Chad A. Mirkin (Northwestern University), "Passive and Active Probe Arrays for Dip-Pen Nanolithography".

N.A. Amro, S. Xu, Gang-Yu Liu, "Patterning surfaces using tip-directed displacement and self-assembly", Langmuir, vol. 16, No. 7, pp. 3006-3009, Apr. 4, 2000.

* cited by examiner

ELECTROSTATIC NANOLITHOGRAPHY PROBE ACTUATION DEVICE AND METHOD

PRIORITY CLAIM

This application is a continuation-in-part of U.S. patent application Ser. No. 11/073,938 filed Mar. 7, 2005, which is a continuation of U.S. patent application Ser. No. 10/647,724 filed Aug. 25, 2003, now U.S. Pat. No. 6,867,443, which is a divisional application of U.S. patent application Ser. No. 10/008,719 filed Dec. 7, 2001, now U.S. Pat. No. 6,642,129, which claims the benefit of U.S. Provisional Application No. 60/307,976 filed Jul. 26, 2001, under 35 U.S.C. § 119.

STATEMENT OF GOVERNMENT INTEREST

This invention was made with Government assistance under Contract Number DAAD19-00-1-0414 and DAAD19-03-1-0065 awarded by the Defense Advanced Research Projects Agency (DARPA), and Award Number EEC-0118025 awarded by the National Science Foundation (NSF). The Government has certain rights in this invention.

FIELD OF THE INVENTION

A field of the present invention is nanotechnology. Another field of the present invention is nanolithography. Still other fields of the present invention include microfabrication and nanofabrication.

BACKGROUND OF THE INVENTION

High-throughput lithography and surface patterning with extremely fine linewidths (e.g., on the order of 10-100 nm) are important for future growth of the microelectronics industry and nanotechnology. However, the resolution of conventional projection optical lithographic systems, still the most widely used in the microelectronics industry, is limited by optical diffraction. While the resolution can be improved by using beam-based direct-writing tools with high energy and short wavelengths, such systems are complex and expensive, typically result in low throughput, and are not capable of depositing patterns made of biological molecules or chemical compounds (though special chemical resists can be used).

It has been discovered that scanning probe microscopy (SPM) probes can be used in nanolithography to produce patterns on surfaces of substrates. SPM probes include a probe tip attached to a suspension mechanism such as a cantilever. An exemplary SPM is an atomic force microscope (AFM). To produce a pattern, the SPM probe applies a patterning compound using the diffusion of a chemical or biological species from a tip of the probe to the surface. In a typical application, the patterning compound travels to the substrate via a meniscus that naturally forms between the tip and the substrate surface under ambient conditions.

This patterning method, generally referred to as Dip Pen Nanolithography (DPN), allows formation of microscale or nanoscale chemical patterns on surfaces using a microscopy probe such as that of an SPM. Such patterns may include, for example, linewidths on the order of 10 nm-100 nm or greater, and ultimate spatial resolution on the order of 5 nm. Features having linewidths in the 10 nm to several micrometer range, for example, can be fabricated using commercially available silicon nitride tips. An exemplary disclosure of a DPN method is contained in PCT/US-00/00319, which is incorporated herein by reference.

A brief description of an exemplary DPN process follows. As shown in FIG. 1, a tip 10 of a cantilevered probe such as an AFM probe is coated with a patterning compound 14, such as a chemical or a biological material, to be deposited on a surface of a substrate 16. The probe tip 10 is placed in contact with the surface. The patterning compound 14 is then free to diffuse from the probe tip 10 to the surface at the point of contact. Features may then be "drawn" on the surface of the substrate 16 by translating the probe tip 10, for example, along a writing direction W. As used herein, "in contact" means that the probe tip 10 is placed in sufficient proximity to the surface of the substrate 16 to permit transferring the patterning compound 14 to the surface by a method such as diffusion. The probe tip 10 may be scanned across the substrate surface, so that patterning compound 14 is transported through a meniscus 20 that forms between the probe tip and the surface. Once on the surface of the substrate 16, deposited molecules 18 anchor themselves to the substrate, forming robust patterns.

DPN offers a number of unique benefits, including direct writing capability, high resolution, ultrahigh nanostructure registration capabilities, and the flexibility to employ a variety of molecules for writing compounds (including biomolecules) and substrates (such as Au, SiO2, and GaAs). Other benefits include the ability to integrate multiple chemical, biochemical, or biological functionalities on a single "nano-chip", a one-layer process for patterning, and the ability to automate patterning using customized software.

DPN technology can be implemented using a low-cost SPM instrument. In an exemplary setup, a DPN probe chip is mounted on an SPM scanner tube in a manner similar to commercially available SPM tips. Precise horizontal and vertical movement of a probe on the probe chip may be attained, for example, using an internal laser signal feedback control system of the SPM machine.

Multiple SPM probes can provide a throughput advantage for DPN over individual probes. For example, multiple probes may be arranged in one- or two-dimensional arrays in a probe chip, providing a plurality of probe tips in simultaneous contact with the surface.

Additional flexibility can be gained by providing actuators that allow individual probes to be independently addressable, most particularly when multiple probes are used, so that the probes can be selectively engaged with the substrate surface independently of other probes. Techniques for independently actuating one or more probes in a multiple-probe array are disclosed in related U.S. Pat. No. 6,642,129.

SUMMARY OF THE INVENTION

Embodiments of the present invention provide a method of selectively actuating a cantilevered probe for applying a patterning compound to a substrate in nanolithography. A probe having a probe electrode and a substrate having a counter-electrode are provided. A voltage is applied to at least one of the probe electrode and the counter-electrode to provide electrostatic attraction between the probe electrode and the counter-electrode. This electrostatic attraction moves the probe, thus moving a tip of the probe in sufficient proximity to the substrate to apply the patterning compound.

In an alternative method of selectively actuating a cantilevered probe for applying a compound to a substrate in nanolithography, a flexible cantilevered probe is provided including a layer of conductive material forming a probe electrode. The probe is anchored to a holder. A counter electrode is provided that is disposed on the holder, facing the probe electrode. The holder and probe is positioned over the substrate so that a tip of the probe is able to apply the compound to the substrate, and so that the probe is disposed between the substrate and the counter electrode. An electrostatic attractive force is generated between the probe electrode and the counter electrode to flex the probe and lift the tip away from the substrate to suspend writing.

DETAILED DESCRIPTION

As disclosed in U.S. Pat. No. 6,642,129, one type of independent probe actuation method is electrostatic actuation. According to an embodiment of this method, motion in the probe is realized by providing a voltage difference between two opposing electrodes.

Figure 1:
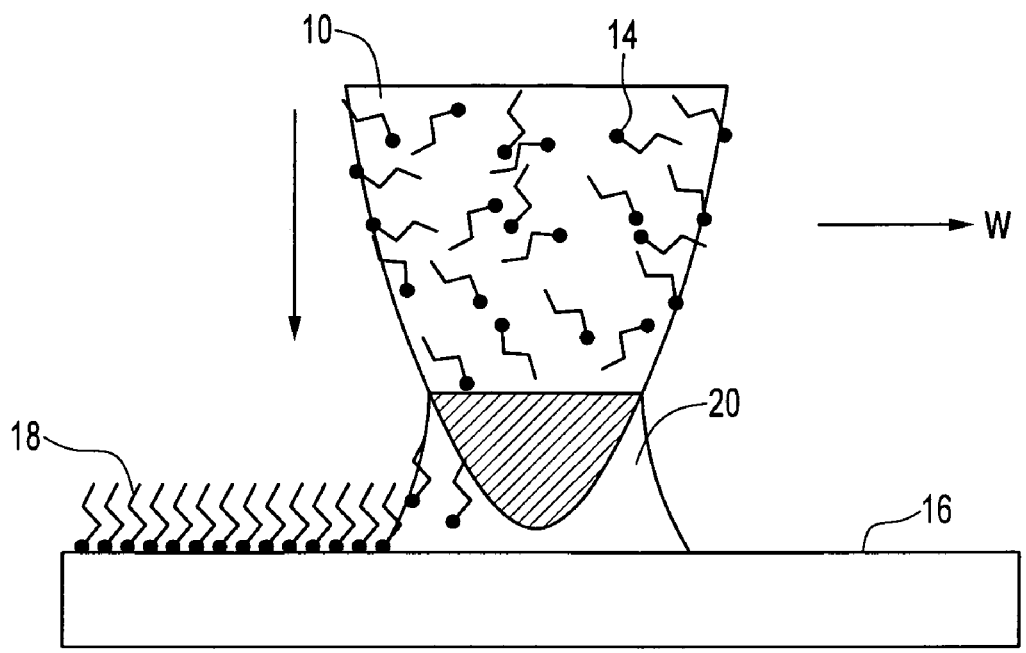
FIG. 1 illustrates an exemplary single-probe Dip Pen Nanolithography (DPN) operation.
Figure 2:
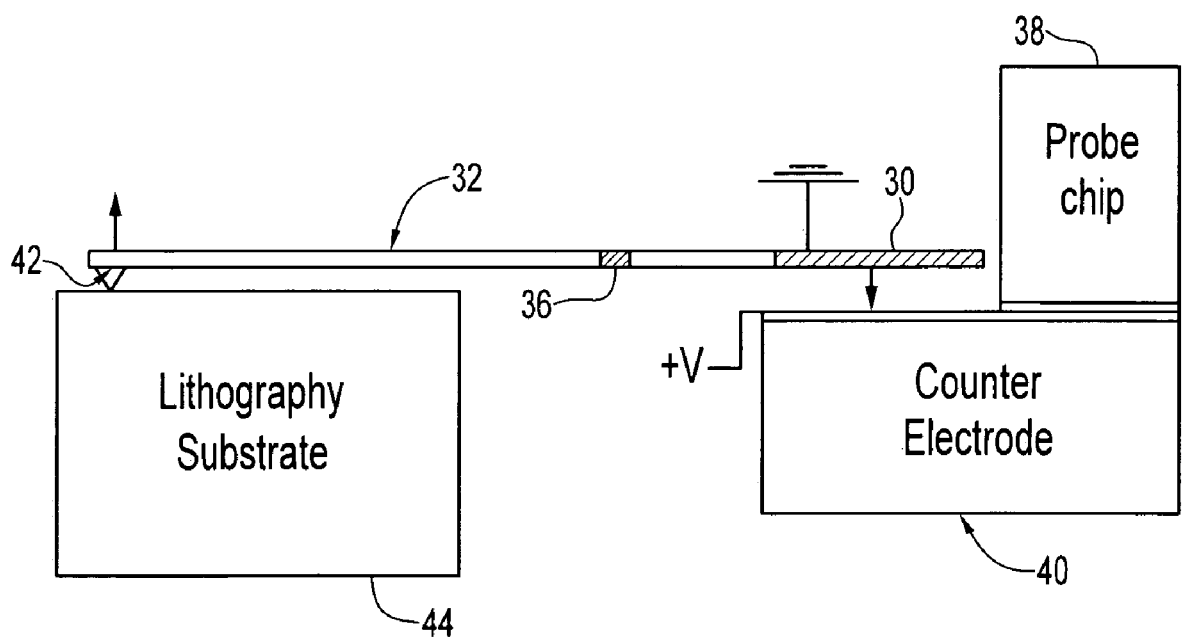
FIG. 2 illustrates a method of electrostatic actuation using a pair of opposing electrodes, as disclosed in U.S. Pat. No. 6,642,129.

An example of electrostatic actuation as provided in U.S. Pat. No. 6,642,129 is shown in FIG. 2. A grounded, moveable probe electrode 30 is at an end of a probe 32, which may be part of a probe array. The probe 32 preferably is supported at or near its midpoint by a flexible suspension 36, such as a torsional spring. The flexible suspension 36 may be incorporated into a probe chip 38, for example. A second, stationary, electrode 40, which may also be incorporated into the chip 38, provides a counter electrode. A probe tip 42 is formed on a flexible end of the probe 32 longitudinally opposing the end including the probe electrode 30. At rest, the probe tip 42 preferably is placed in contact with a substrate 44 by positioning the probe chip 38 over and near the substrate.

When a voltage difference is selectively applied between the electrodes 30, 40, such as by applying a voltage to the counter electrode 40 while the probe electrode 30 remains grounded, an attractive force is generated between the electrodes. The suspension 36 acts as a fulcrum, so that when the electrodes 30, 40 move together the probe 32 angularly deflects about the suspension, and the probe tip 42 lifts away from the substrate 44 to suspend patterning. Thus, the probe 32 can be selectively actuated by application or removal of a voltage difference between the electrodes 30, 40. If the probe 10 is part of a probe array, complex patterns may be produced by selectively actuating one or more probes as the array passes over a substrate.

Probes and electrostatic actuators may be constructed using micro-electromechanical systems (MEMS) fabrication methods. For example, both electrodes 30, 40 may be incorporated into a MEMS device. However, though these formation methods are effective, they present several difficulties, particularly when multiple probes are used, such as with a probe array. As one example, due to current limitations of surface micromachining, the probe electrodes 30 in a probe array typically can only be produced having relatively small displacement distances between them. This limits their range of motion, and an insulating layer thus may be needed in certain cases to prevent the probe electrodes 30 from electrically shorting if they touch.

The probe electrodes 30 in a probe array can also consume a significant amount of wafer surface area, resulting in probe tips in the array that have relatively large tip-to-tip spacing. One method of addressing this concern provides an electrostatic actuation mechanism embodied in a comb drive, which includes interdigitated electrodes that pull together when a voltage difference is applied.

Further, though the force generated by electrostatic actuation, for example in MEMS technology, can be made large compared to other actuation methods, such as thermal, magnetic, piezoelectric, etc., it can be difficult to produce electrostatic actuation that provides sufficient out-of-plane probe motion for a probe tip (e.g., sufficient motion to suspend or initiate writing). Also, in the electrostatic actuation methods described above, fabrication may be complex. This may limit large-scale production of such devices.

In an exemplary embodiment of the present invention, a nanolithography probe includes an anchored, flexible cantilever, a probe tip, and a probe electrode of an electrostatic actuator. A substrate includes a counter-electrode of the actuator. The probe electrode and/or the counter-electrode is coupled to a voltage source, and a voltage or voltages is/are applied to provide an attractive electrostatic force between the probe and the substrate. The probe moves (for example, deflects), pulling the probe tip into contact with (i.e., in sufficient proximity to) the surface of the substrate. This initiates the writing process (nanolithography operation), such as by applying a patterning compound disposed on the probe tip to the substrate.

Figure 3:
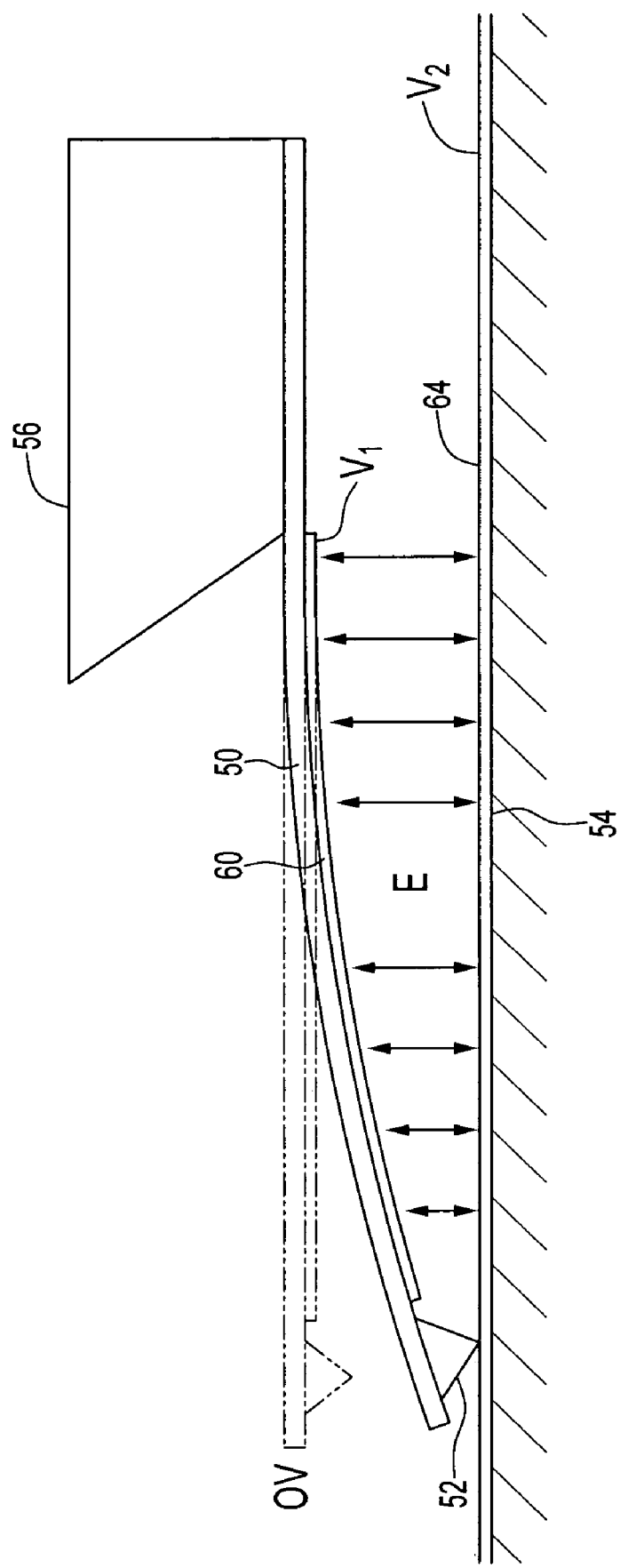
FIG. 3 shows an exemplary substrate-coupled electrostatic nanolithography probe actuation method, according to an embodiment of the present invention.

An exemplary device and operation method is shown by example in FIG. 3. A cantilevered probe 50 is positioned so that a probe tip 52 is placed over a substrate 54, but not in contact with the substrate, so that the writing process cannot take place. The probe 50 preferably is positioned so that it longitudinally extends substantially parallel to the substrate 54 when at rest. However, it is contemplated that the probe 50 may extend longitudinally at an angle to the substrate 54. The required separation between the probe tip 52 and the surface of the substrate 54 when the probe 50 is at rest may vary depending, for example, on the electrostatic force to be generated, the length and flexibility of the probe, and/or the writing environment (e.g., ambient humidity may affect the size of a water meniscus that typically is formed to allow writing).

Another possible factor affecting the required separation is the required releasing force for the probe 50 to suspend writing. For example, the spring force provided by the deflected probe 50 should be sufficient to overcome the adhesive force created between the probe tip 52 and the surface of the substrate 54, if no other force is provided to lift the probe tip. If the spring force is not sufficient, the gap should be increased to increase the probe deflection and thus the force available for release of the probe tip 52.

A holder chip 56, such as, but not limited to, a silicon, quartz, or borosilicate glass substrate, supports the probe 50 and translates the probe over the substrate 54. The probe 50 is anchored to the probe chip 56, but preferably is otherwise flexible, providing a flexible end supporting the probe tip 52, though an additional support may be provided between the probe tip and the anchor point of the probe chip. For example, an additional support may provide a pivot point if the pivot point resists rotation of the probe 50, so as to restore the probe to zero deflection when actuation voltage (s) is/are removed (or if some other releasing force was provided).

The probe 50 may be formed, as one example, from silicon nitride. The probe tip 52, preferably configured similarly to hollow tips of AFM probes, applies a patterning compound to the substrate 54. An exemplary writing method is the diffusive method described above and illustrated in PCT/US-00/00319. In this embodiment, because the probe tip 52 is positioned above and out of contact with the substrate 54 (as seen in the probe shown in phantom) when the probe is at rest, the patterning compound is not being applied to the substrate in this inactive state.

An actuator for moving the probe 50 includes a probe electrode 60 incorporated with the probe. The probe electrode 60 may be, for example, a layer of a conductive material such as gold that is formed on a surface of the probe 50. This may be an underside (when the probe tip 52 is facing downward) of the probe, facing the substrate 54. However, it is contemplated that the probe electrode 60 may be disposed on an opposing (upper, as shown in FIG. 3) side of the probe 50, within the probe itself if the probe is layered, or the probe material may itself be conductive. If the probe material is conductive, the probe tip 52 may need to be insulated to prevent a short circuit when it touches the substrate 54.

Preferably, the probe electrode 60 has as large an area as possible. For example, the probe electrode 60 may substantially cover the underside of the probe 50, extending longitudinally from beyond the probe chip 56 and terminating short of the probe tip 52. However, it is also preferred that the probe electrode 60 not extend beyond the lateral edges of the probe 50. In this way, forming multiple probe electrodes 60 does not require additional separation between individual probes 50 if multiple probes are provided with the chip 56. The probe electrode 60 is connected to a controllable voltage source (shown as $V_1$) by one or more leads 62 (see FIG. 4), and preferably a single lead, or it may be grounded.

As another component of the actuator, the substrate 54 includes a counter-electrode to the probe electrode 60 that preferably is provided by a conductive layer 64. For example, the surface of the substrate 54 may be partially or completely covered with a layer of conductive material, such as gold. Alternatively, the substrate may be fully formed or partially formed from a layer of conductive material. The counter-electrode 64 may be a bottom layer disposed underneath the substrate 54, or it may be an intermediate layer, if the substrate is layered. Other materials may be deposited over the counter-electrode 64 to maintain chemical compatibility with a patterning compound being deposited. The counter-electrode 64 may be formed by lithographic methods. To improve adhesion (during post processing, for example) a suitable adhesion layer may be used. For example, for a gold counter-electrode on a silicon, silicon dioxide, or silicon nitride surface, chromium or titanium may be used as an adhesion layer. It is preferred that the final upper surface of the substrate 54 be relatively flat, as a relatively constant gap between the probe 50 (at rest) and the substrate 54 should be maintained.

It is contemplated that the patterning compound can be deposited on top of the counter-electrode 64. It is also possible that an insulating substrate can be used in place of an actual electrode due to the presence of a thin water layer that coats all surfaces in a humid environment. This water layer absorbs ions from the environment, provides a pathway for their motion, and may allow actuation over insulating surfaces. If the substrate 54 has any charge mobility, the electric field from the probe electrode 60 forces charge displacement to occur in the substrate 54, and may allow actuation over an otherwise ungrounded substrate.

The counter-electrode 64 is electrically coupled to a voltage source (shown as $V_2$) or to ground, via one or more leads, and preferably a single lead. Preferably, both the probe electrode 60 and the counter-electrode 64 are connected to respective voltage sources $V_1$, $V_2$. If the substrate 54 is conductive and significantly larger than the probe 50, it may be possible to obtain actuation without connecting the counter-electrode 64 to a voltage or ground. In this case, actuation occurs when voltage on the probe electrode 60 induces charge displacement in the substrate 54.

In a preferred operation, the probe 50 when not actuated is held away from the substrate 54, so that the probe tip 52 is not in contact with the substrate, and no writing takes place from that probe. To actuate the probe 50 and initiate writing, a voltage difference produced between the probe electrode 60 and the counter-electrode 64 sets up an electric field. The potential energy gradient between the electrode 60 and the counter-electrode 64 creates an electrostatic attractive force E that pulls the probe electrode 60 generally toward the counter-electrode (as shown, downward). The probe 50 is anchored to the probe chip 56 or other probe holder, and preferably is restrained from moving perpendicularly to the surface of the substrate 54 in response to the provided electrostatic force. The electrostatic attractive force E thus overcomes the spring force of the probe 50 to deflect the probe, moving the probe tip 52 of the probe in sufficient proximity to the surface of the substrate 54, which preferably is held stationary. Writing is initiated when the probe tip 52 makes contact with the substrate 64.

In an exemplary operation, a first, positive voltage is applied as $V_1$ to the probe electrode 60, while a second, negative voltage is applied as $V_2$ to the counter-electrode 64, creating a voltage difference and producing a potential energy gradient. Alternatively, a positive voltage is applied as $V_1$ to the probe electrode 60 of the probe 50, while the counter-electrode 64 of the substrate 54 remains grounded, or vice versa. It will be understood that the particular voltages applied as either $V_1$ or $V_2$ to create a voltage difference can vary. It will also be understood that though electrostatic fields will be generated in various directions, and such directions will vary as the probe 50 deflects toward the substrate, the overall field for an electrostatic attractive force generally can be represented by the arrows illustrated in FIG. 3.

In another embodiment, both electrodes may be connected to a voltage source, and voltages may be applied so that the probe 50 and the substrate 54 can be selectively repelled from one another. In this embodiment, the probe 50 and the substrate 54 are in contact when not actuated (so that writing is possible) and are actuated to separate them. For example, the probe electrode and the counter-electrode can be made to repel one another to lift the probe tip 52 and place it out of contact with the substrate 54, selectively suspending the writing process. This can be accomplished, for example, by creating a like charge in both electrodes, holding both electrodes at the same potential (positive or negative). The like charges repel, forcing the probe 50 away from the substrate 54 against a cantilever spring force trying to pull the probe into contact with the substrate.

Since the counter-electrode 64 is combined with the substrate 54, a single probe structure provides both probe and probe electrode. In this way, fabrication of the probe chip 56 can be simplified. Also, due to the large breakdown voltage of air (up to 170 V/micron), large voltage differences can be applied across the electrodes, resulting in large deflection forces and correspondingly large deflections. However, patterning is possible in other environments, including vacuum, solvent, or other non-air environments. Laboratory experiments performed by the present inventors have produced deflections of the probe in excess of 25% of the probe length. Greater force generation, deflection, and probe tip displacement (greater range of actuator motion) can be provided compared to previous electrostatic actuation methods, and probe-to-probe crosstalk can be reduced.

Figure 4A:
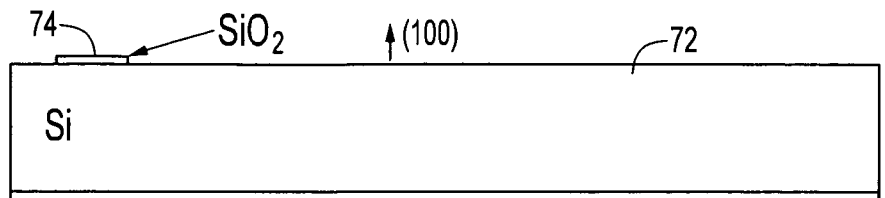
FIG. 4 is a side cut-away view illustrating a preferred method of forming one or more electrostatically actuated probes, according to a method of the present invention.
Figure 4B:
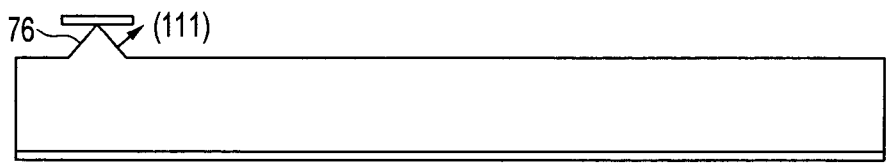
Figure 4C:
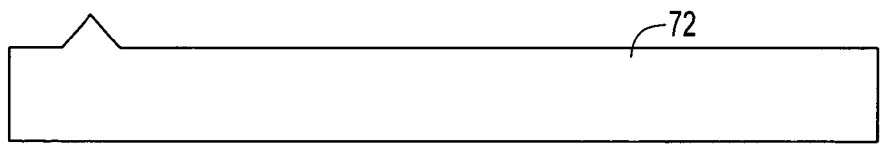

FIGS. 4A-4G show a preferred method of forming the probe chip 56 including one or more electrostatically actuable probes 50. Referring to FIG. 4A, a thin film (as a nonlimiting example, at least a few tens of nanometers, and most preferably about 100-200 nm) layer of silicon dioxide 70 is grown on a back side of a silicon substrate 72 to form a protective mask. Preferably, the silicon substrate 72 is a <100> oriented silicon wafer. Another thin film layer of silicon dioxide 74 is grown and photolithographically patterned on a portion of a front side of the substrate 72 to provide a protective mask for creating the probe tip 52. Next, as shown in FIG. 4B, the front side of the silicon substrate 72 is etched, for example by anisotropic wet etching in ethylene diamine pyrocatechol (EDP), to define a pyramidal silicon form 76 of the probe tip 52. The silicon dioxide layers 70, 74 on the front and back sides are then removed (FIG. 4C).

Figure 4D:
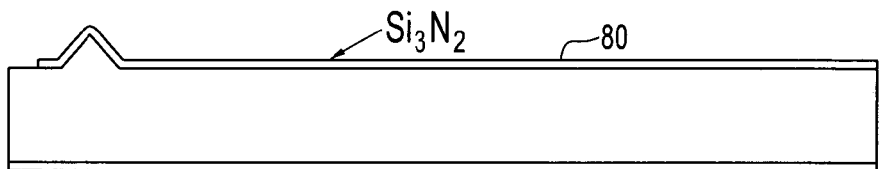

A layer of silicon nitride 78 is deposited on the back side of the etched silicon substrate 72, for example by low pressure chemical vapor deposition (LPCVD), and another layer of silicon nitride 80 is deposited on the front side, including deposition over the pyramidal silicon form 76 defining the probe tip 52. The layer of silicon nitride 80 on the front side is patterned to provide the cantilevered probe 50 and the probe tip 52, as shown in FIG. 4D. Preferably, the silicon nitride layer 80 has a thickness between 0.1 and 2 microns, and the probe tip 52, if silicon nitride, has a radius of curvature approximately equal to the film thickness, assuming the silicon form 76 is perfectly sharp.

Figure 4E:
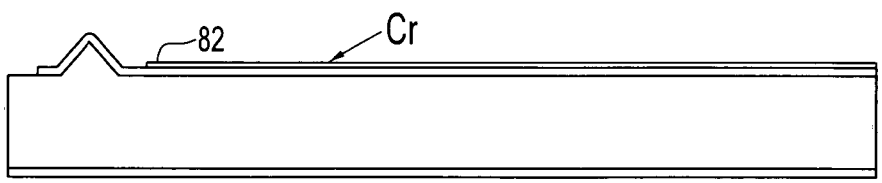
Figure 4F:
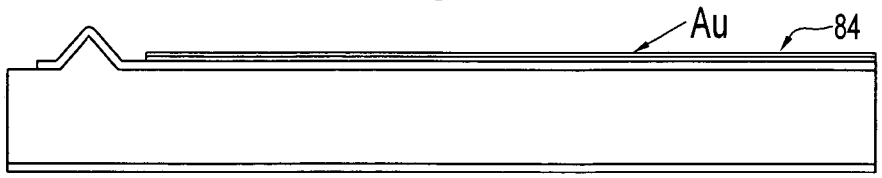

Next, as shown in FIGS. 4E and 4F, a layer of chromium 82 and a layer of gold 84 are successively deposited and patterned, respectively, on the front side of the silicon nitride layer 80 to provide the probe electrode 60 and the lead 62. Particularly, the gold layer 84 provides the conductive layer forming the probe electrode 60 and the lead 62 connecting the electrode to the voltage source, and the chromium layer 82 serves as an adhesion layer. Exemplary thicknesses for the chromium layer 82 are between 5-15 nm, and exemplary thicknesses for the gold layer 84 are between 10-100 nm for the probe electrode 60 and the same thickness for the lead 62. The gold layer 84 may also be used to form bonding pads (not shown), for connecting to the voltage source $V_1$. In this case, for example, the gold layer 84 should be somewhat thicker (for example 100-200 nm) to improve reliability of mechanical joints. Only a single electrode is required for the probe 50 according to preferred embodiments of the present invention.

Figure 4G:

As shown in FIG. 4G, the silicon nitride layer 78 on the back side of the silicon substrate 72 underneath the probe 50 is removed, and the substrate is etched (preferably via EDP etching) to undercut the substrate. This frees the cantilevered probe 50 and at least partially forms the probe chip 56. Preferably, the etched portion of the probe chip 56, which provides an anchor or a handle for the probes 50, is etched to a <111> orientation. In a preferred embodiment, the lead 62 is connected to the voltage source $V_1$ (via bonding pads, for example) for selective charging of the probe electrode 60.

Figure 5A:
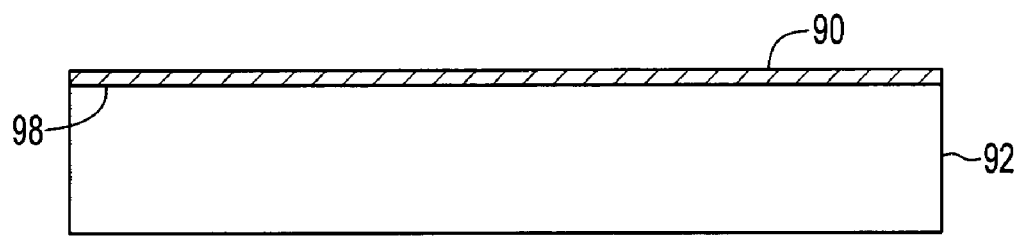
FIG. 5 shows an exemplary method of forming a substrate, according to a method of the present invention.
Figure 5B:
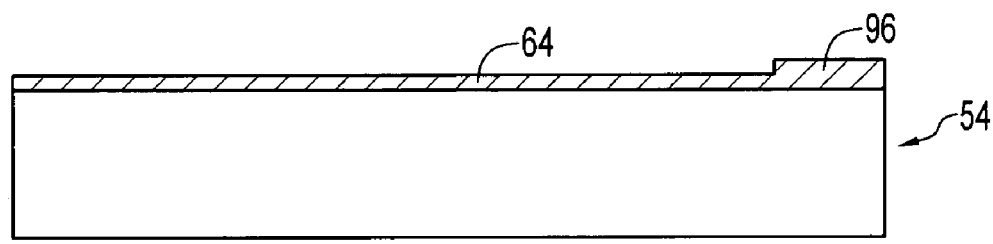

To fabricate the counter-electrode 64 in an exemplary embodiment, as shown in FIGS. 5A-5B, a layer of a conductive material 90, for example gold, is deposited on a surface of a substrate such as a silicon wafer 92 (FIG. 5A). The deposited layer then is patterned (FIG. 5B) to form the counter-electrode 64 and a lead 96. Preferably, the layer of conductive material 90 is deposited on an upper substrate surface 98 (that is, the surface facing the probe tip). An adhesion layer (not shown) may be deposited and patterned on the substrate before the conductive layer if necessary. The lead 96 is connected to the second voltage source $V_2$, or to ground, in a suitable manner. The patterning compound 14 may be applied to the layer 90 as a writing surface. As explained above, however, it is also contemplated that the layer of conductive material 90 may be formed within or underneath the substrate 54, in which case the patterning compound 14 may be applied to a different surface.

Exemplary patterning compounds 14 include a hydrophobic patterning compound with a chemical affinity for the substrate 54, such as, but not limited to, 1-octadecanethiol (ODT) or mercaptohexadecanoic acid (MHA). An exemplary biocompound is thiol modified DNA. Due to the presence of a strong electric field created by the described electrostatic actuation, molecules of the patterning compound 14 having a net charge may respond to a force that accelerates or impedes their migration from the probe tip to the substrate surface. Further, the shape of the fluid meniscus may be altered by the effect of the electric field on the fluid's contact angle with the surfaces it touches.

In both cases described above, because the polarity of the applied electrostatic field can be modified by the user, there exists a way to directly control an environmental parameter that affects ink deposition. This may, for example, permit the deposition of chemicals in ways that are not possible using conventional DPN.

In addition to these benefits, because the probe electrode 60 preferably is only as wide as the cantilevered probe 50, a small footprint is provided. Both the electrostatic force and the probe stiffness are approximately a linear function of the width of the probe electrode 60 and of the probe 50, respectively. As a result, a preferred actuation method is relatively insensitive to probe width, and it scales well to very small sizes such as sub-micron dimensions, possibly down to the limit of projection lithographic fabrication methods. This creates the potential for ultra-high density probe arrays with better performance than previous electrostatic and thermally actuated arrays.

Further, though it has been possible previously to provide piezoelectric actuation of a DPN probe, it has been difficult for piezoelectric actuators to provide adequate deflection for contact mode lithographic applications unless they are made to be larger than other actuators (such as thermal actuators). This makes the creation of high-density arrays of DPN probes difficult. Further, suitable piezoelectric materials have severe limitations on their process compatibilities, making it difficult and expensive to produce devices using them.

Figure 6:
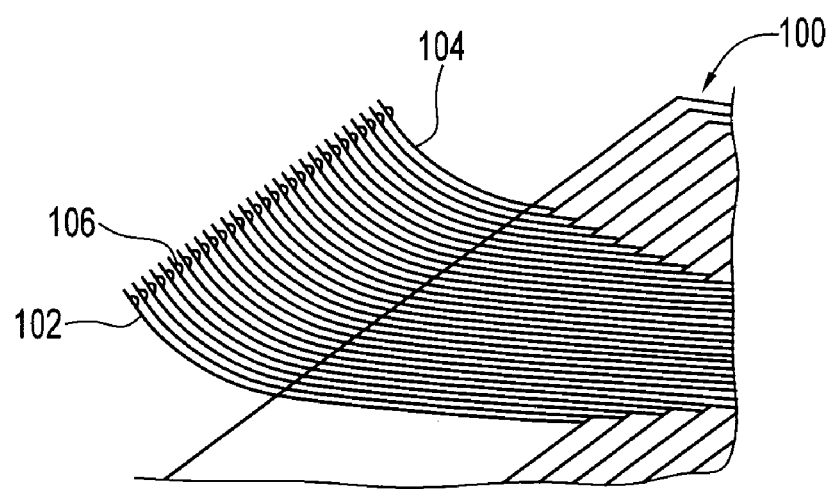
FIG. 6 shows a probe array including a plurality of parallel, electrostatically actuated probes, according to an embodiment of the present invention.

Multiple probes having individual, selectively actuable electrodes can be disposed on a probe array chip for more efficient nanolithography. An exemplary probe array chip 100 is shown in FIG. 6. The chip 100 includes anchored, cantilevered silicon nitride probes 102, as small as 10×100 μm, each including a gold probe electrode 104 which is respectively coupled to a selectable controllable voltage source. In an exemplary embodiment, each probe 102 is 10 μm wide and 100 μm long, and includes a silicon nitride probe tip 106.

In tests performed by the present inventors, the probe array chip 100 was placed over a substrate so that the probe tips 106 were not in contact with the substrate. The substrate in an exemplary method included a 20 nm gold layer as the counter-electrode 64, which was deposited on a silicon wafer. The electrode of one probe was energized while the substrate was grounded. The energized probe pulled in to the substrate and performed lithography. Individual probes in the probe array chip 100 were observed to actuate with deflections of individual probe tips 106 on the order of 20 to 30 μm. Probe tips of non-selected probes remain out of contact with a substrate, so that selective actuation and thus ability to produce complex patterns are available. Patterning with octadecanethiol was successfully performed.

In an alternative, and preferred, electrostatic actuation device and method, a probe incorporates a conductive layer providing a probe electrode. A holder to which the probe is anchored provides a counter electrode, which is disposed above the probe when the probe is positioned over a substrate. To suspend writing, an electrostatic attractive force is generated between the probe electrode and counter electrode to deflect the electrode and raise a tip of the probe. This device and method provides improved tip deflection, reduces the array pitch, and is especially suitable for multiprobe arrays.

Figure 7:
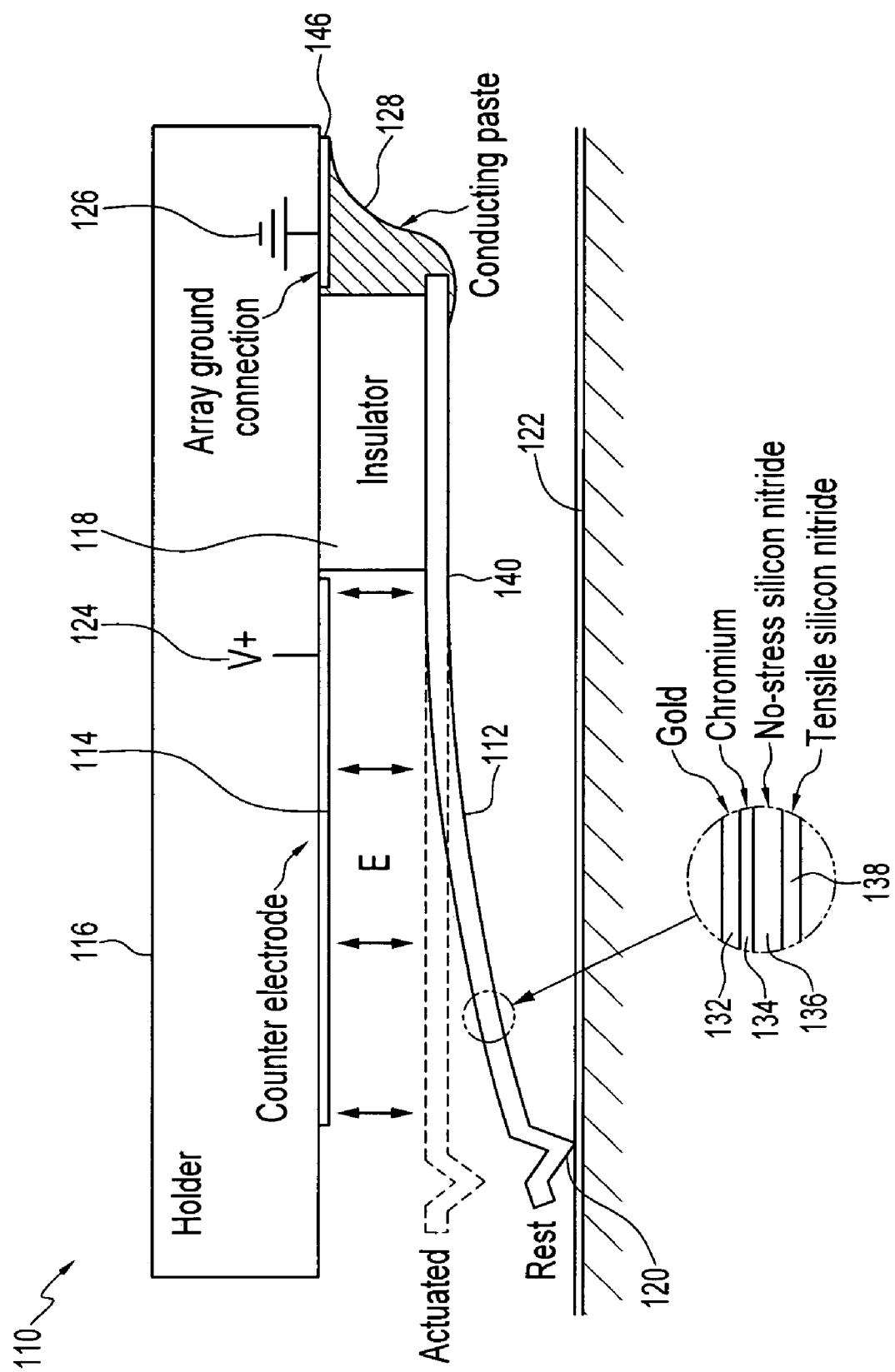
FIG. 7 shows an exemplary probe for electrostatic actuation and a holder providing a counter electrode, according to a preferred embodiment of the present invention.

FIG. 7 shows an electrostatically actuated probe chip 110 according to this alternative embodiment of the present invention. A flexible probe 112 acts as an electrode, preferably by incorporating a layer of conductive film. The chip 110 may include multiple probes 112, which may be arranged in an array and anchored to the chip. A counter electrode 114, preferably attached to a holder 116 anchoring the probe or probes 112, is disposed above each of the probes, separated by an insulator 118. In a preferred embodiment, the holder 116 is made of glass and the insulator 118 is SU-8 photoepoxy. If more than one probe 112 is provided on the chip 110, the holder 116 may include multiple counter electrodes 114, respectively.

At rest, the probe 112 is oriented such that a tip 120 is in contact with a surface 122 for writing. To actuate the probe 112 and thus suspend writing, an actuation potential 124 is applied to the counter electrode 114. The probe or probes 112 is/are grounded by coupling to a ground trace 126, preferably by a conducting paste 128. Thus, the applied voltage 120 to the counter electrode 114 generates an electrostatic attractive force E that pulls the tip 120 off of the surface 122. By grounding the surface 122, an electric field between the tip 120 and the surface 122 is eliminated.

Preferably, if multiple probes 112 are used on the chip 110, all of the probes are manufactured from the same film. This preferred configuration eliminates the need to individually wire bond probes to ground pads on the holder 116. This allows the design to be scaled to a larger number of probes without making the assembly process more difficult.

Figure 8:
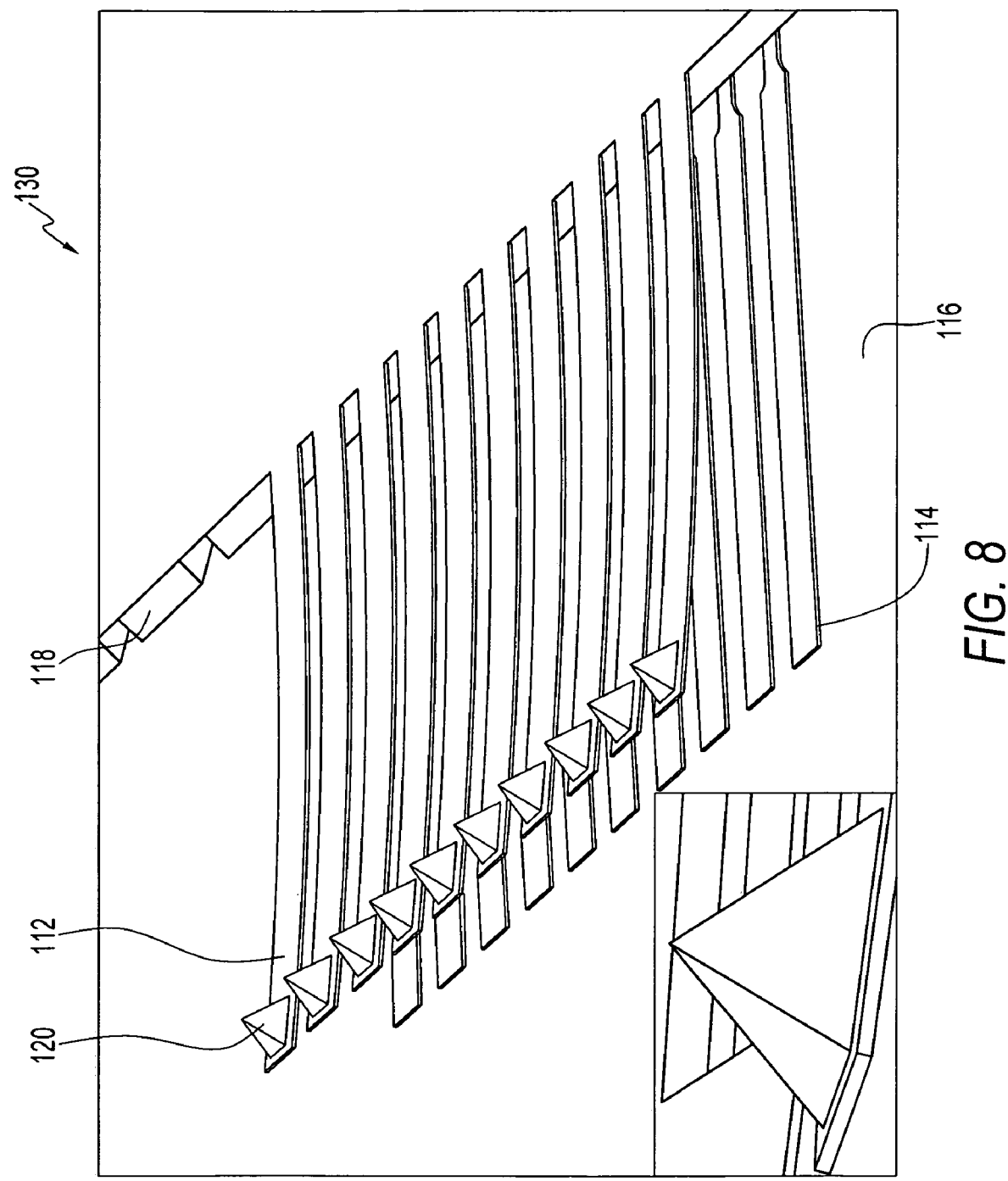
FIG. 8 shows an array of probes for electrostatic actuation according to the method of FIG. 7.

FIG. 8 shows a portion of a probe chip 130 including an array of probes 112 and corresponding counter electrodes 114. In the exemplary chip 130, each probe 112 is 20 μm wide, 120 μm long, and 0.65 μm thick. The spring rate is approximately 0.11 N/m. The array pitch is 30 μm, which is much smaller, for example, than the pitch typically achieved for thermal bimetallic actuation. The tips 120 are 7-8 μm tall and have an apex radius of less than 100 nm.

Referring again to FIG. 7, in an exemplary embodiment, each probe 112 is cantilevered to the holder 116, and is fabricated from a film stack that includes at least one layer of silicon nitride, an adhesive layer, and a conductive layer. In a preferred embodiment, the probe 112 includes a layer of gold 132 providing the probe electrode. The gold layer 132 is adhered by a layer of chromium 134 to a silicon nitride layer, which includes a layer of stress-free silicon nitride 136 and a layer of tensile silicon nitride 138.

The stress-free silicon nitride and the tensile silicon nitride layers 136, 138 are oriented to cause the probe 112 to deflect away from the holder 116 after release, as shown in FIG. 7. This increases the clearance between a base 140 and the substrate 122 during lithography. At the base 140, the gap between the probe 112 and the counter electrode 114 is 20 μm. At the tip 120, the gap is approximately 25 μm.

Figure 9:
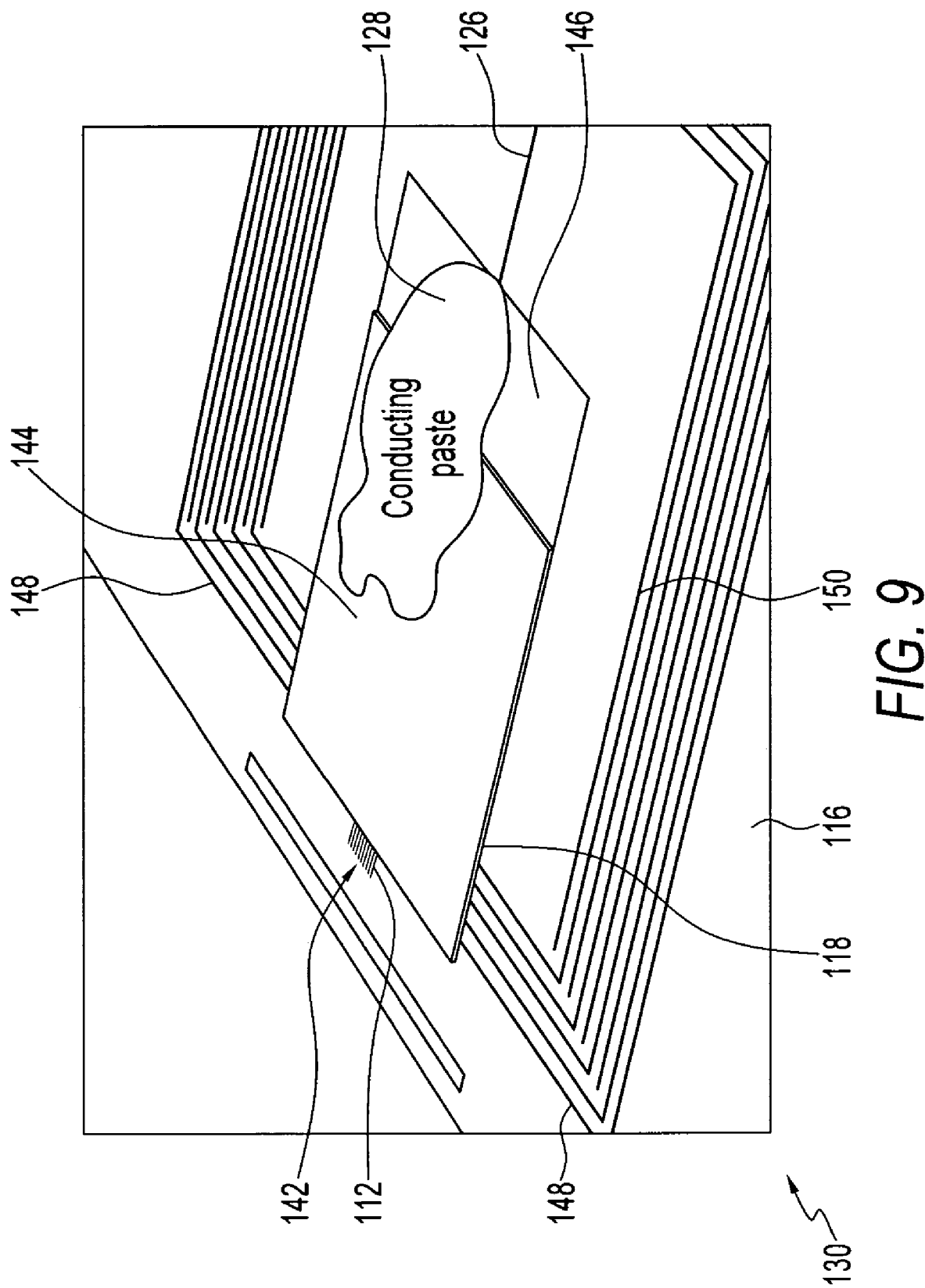
FIG. 9 shows a packaged probe array including actuator traces and ground traces on the holder surface.

FIG. 9 shows a packaged array 142 of probes 112 on the probe chip 130. The probes 112 are fabricated in this exemplary embodiment as part of a 2 mm×2 mm film stack 144, which is separated from the glass holder 116 by the insulator 118. To ground the probes 112, the film stack 144 is electrically connected to a ground pad 146 by the conducting paste 128, which is connected to the ground trace 126.

Figure 10:
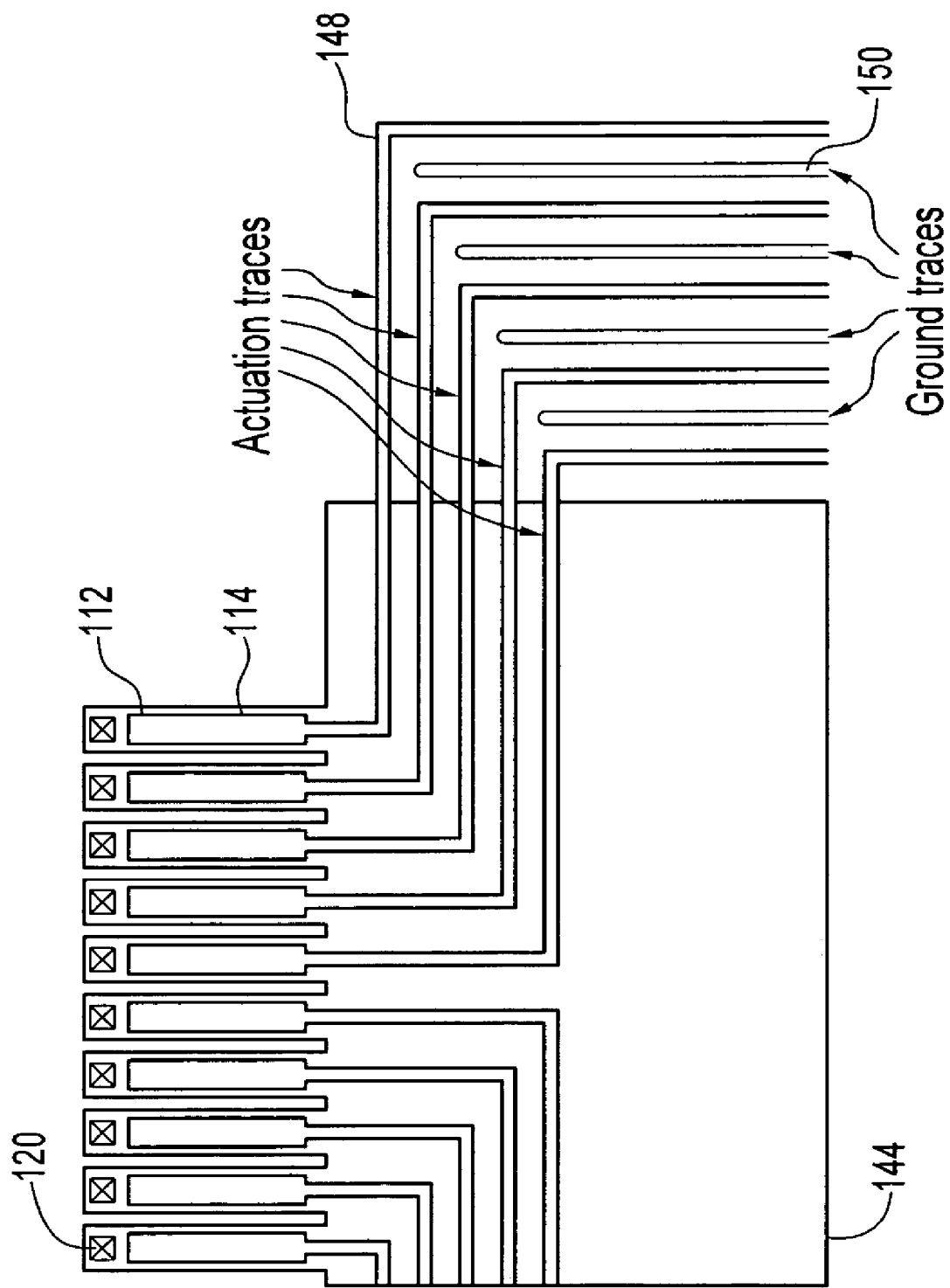
FIG. 10 shows an exemplary actuator and ground trace layout.

Referring also to FIG. 10, actuator traces 148, one for each probe 112, approach the array 142 from each side and pass under the insulator 118 on their way to the counter electrodes 114. A ground trace 150 is arranged between each of the actuator traces 148, to reduce the electrostatic interaction between the actuator traces. Without the ground traces 150, when one probe 112 is actuated, the electric field around its actuator trace 148 may induce a charge in the adjacent traces, resulting in unintentional actuation of the adjacent probes. The ground traces 150 reduce this effect significantly at the cost of a small increase in system capacitance.

Use of a large film stack 144 minimizes the risk that the paste 128 will wet around the edge of the device and short the actuator traces 148 when it is applied. A preferred conducting paste 128 is carbon-based and becomes electrically conducting after the solvent evaporates. The paste 128 may be applied by hand or, preferably, by a controlled deposition method (a micro-dropper, etc.).

Figure 11:
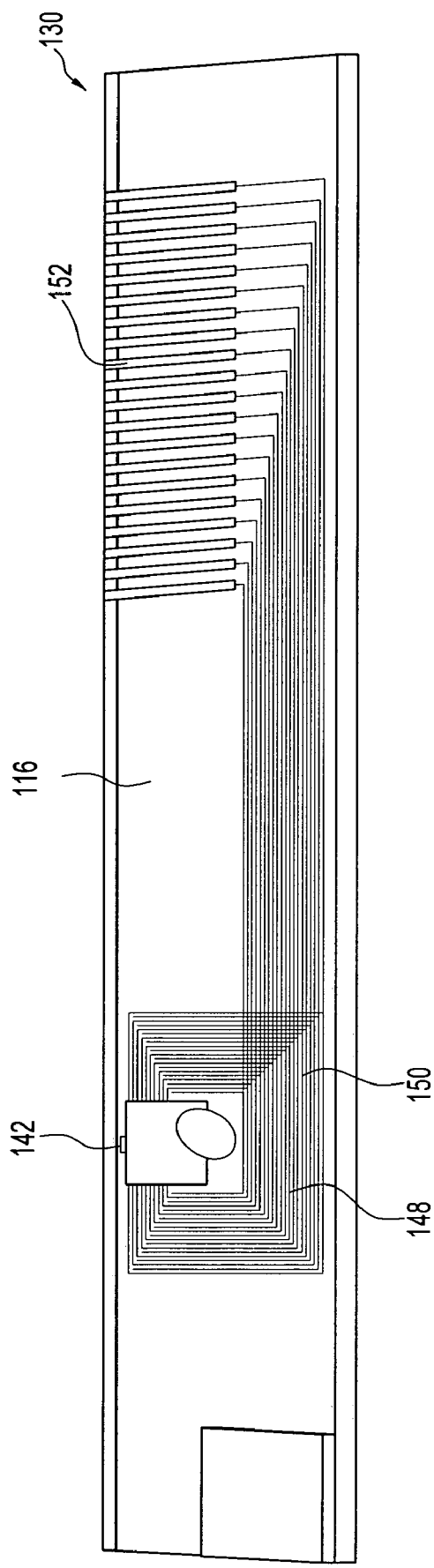
FIG. 11 shows an exemplary packaged probe assembly on a glass holder.

The complete probe chip 130 according to an exemplary embodiment is shown in FIG. 11. The holder 116 in this embodiment is a glass slide that is 35 mm long, 6 mm wide, and 1 mm thick. Using glass allows the probes 112 to remain visible through the holder 116 during lithography. Preferably, a positioning device (not shown), such as an AFM scanner, is provided for manipulating the probe chip 130, including the array 142, over a substrate. The actuator and ground traces 148, 150 extend from the probe array 142 to an external connection region 152, where they match up to an external connection, for example a 20-conductor, 0.5 mm pitch cable.

Figure 12:
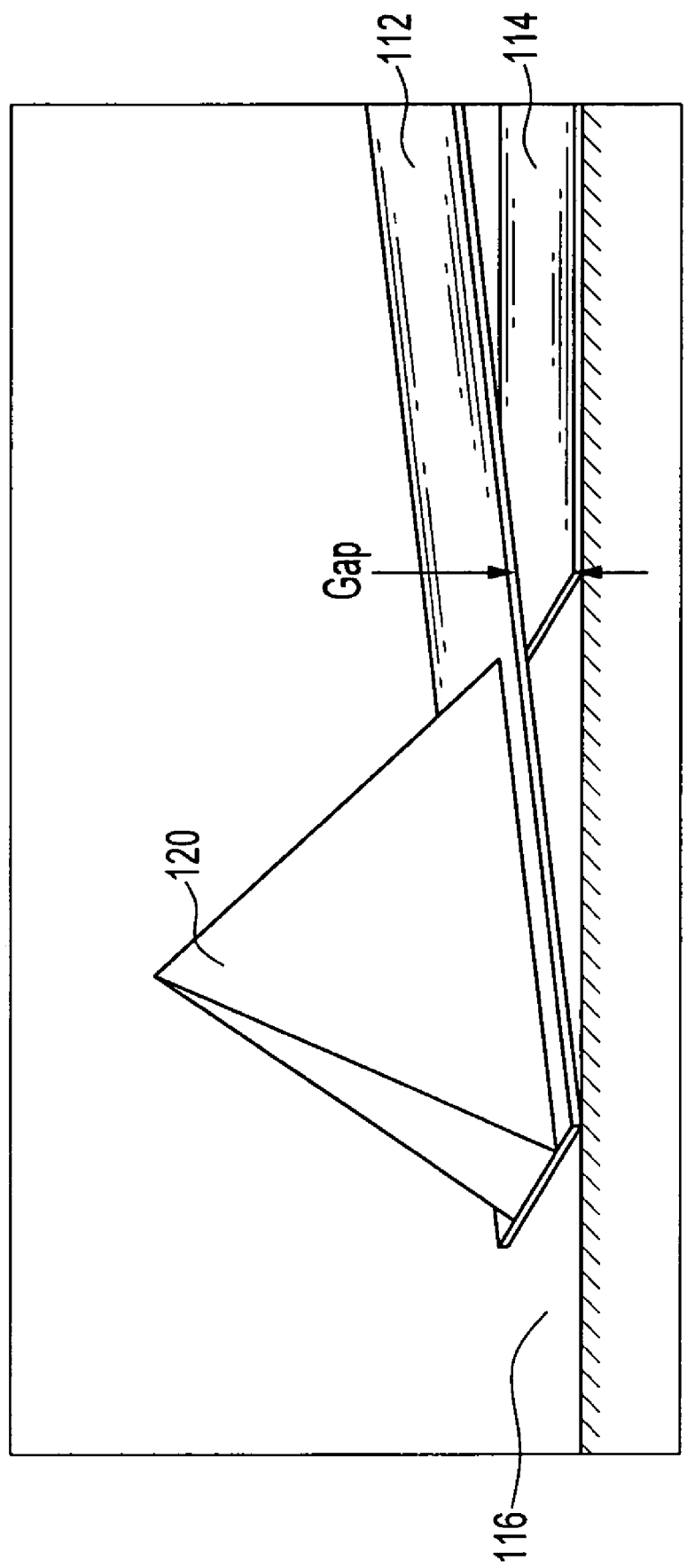
FIG. 12 shows a snapped-in probe.

A potential problem of snap-in of the probe 112 (e.g., see G. J. O'Brien, D. J. Monk, and L. Lin, "MEMS cantilever beam electrostatic pull-in model," presented at Design, Characterization, and Packaging for MEMS and Microelectronics II, Adelaide, Australia, 2001) is created due to the grounded metal film layer 132 on each probe facing the counter electrode 114. In preferred embodiments, various features may be used to mitigate this problem. First, the probes 112 may always be operated at less than their experimentally estimated snap-in voltage. As another solution, as shown in FIG. 12, the counter electrode 114 may be made shorter than the probe 112 to prevent them from touching if the probe 112 pulls in. The shorter counter electrode 114 may also be helpful for the probe tip 120 to be visible through the holder 116 during lithography. As yet another solution, a resistance, for example 200 MΩ, may be inserted in each actuator's electrical pathway via the actuator trace 148. This limits the steady-state short circuit current in preferred embodiments to less than a predetermined amount in the event that the probe 112 touches the counter electrode 114. This amount may vary, for example, depending on operating voltage, resistance value, etc.

Figure 13A:
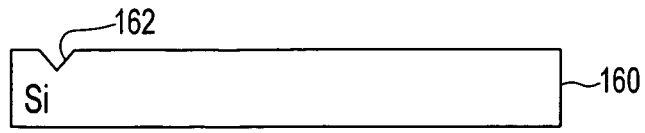
FIGS. 13A-13E show an exemplary process for forming a probe assembly including a counter electrode.

FIGS. 13A-13E show an exemplary fabrication process for the probe array chip 130. The process starts with an oxidized (100) silicon wafer 160 (FIG. 13A). Thermal oxidation, for example, may be used. Square openings in the oxide layer are etched (e.g., buffered HF) where each tip 120 will be located. Pyramid trenches 162 are then anisotropically etched (e.g., using 35% KOH) in the silicon substrate 160 and the remaining oxide is removed.

Figure 13B:
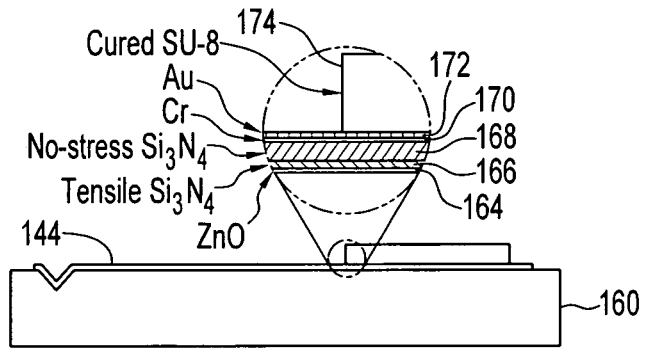
Figure 13C:
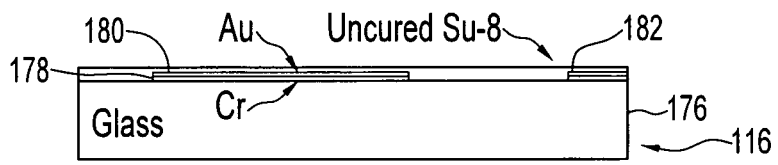
Figure 13D:
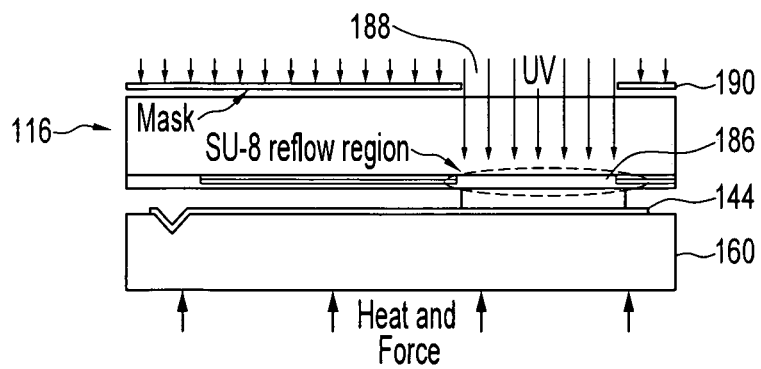
Figure 13E:
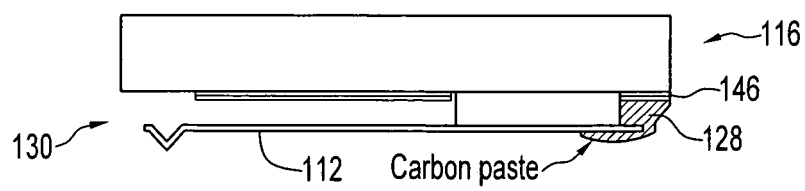

Next, as shown in FIG. 13B, to form the probe array film 144, the probe array film stack materials are deposited in the following order: a sacrificial layer of 100 nm zinc oxide 164 (e.g., RF magnetron sputtering); 80 nm tensile silicon nitride 166 (e.g., PECVD); 500 nm stress-free silicon nitride 168; 5 nm chromium 170 (e.g. thermal evaporation); and 20 nm gold 172 (e.g., thermal evaporation). All of the layers 164, 166, 168, 170, 172 are patterned with the same mask to form the probe array film 144. A 20 μm thick layer 174 of SU-8 25 is then spin-coated and patterned to form the insulator 118. The wafer 160 is then diced into individual dies. For example, the zinc oxide layer 164 may be etched using 0.5% HCl, the silicon nitride layers 166, 168, may be etched using tetrafluoromethane reactive ion etching, the chromium layer 170 may be etched using a Cr etchant (e.g., CEP-200, Microchrome), and the gold layer 172 may be etched using an Au etchant (e.g., TFA, Transene).

The holder 116 fabrication begins (FIG. 13C) by trimming a glass, plastic, ceramic, or other suitable material substrate 176 to a desired size, as a nonlimiting example to a 35 mm×6 mm×1 mm size. A 15 nm chromium adhesion layer 178 and 200 nm gold electrode layer 180 are then deposited and patterned to form the ground and counter electrode traces 148, 150. The entire surface is then coated (e.g., spun on) with a 2 μm-4 μm thick layer of SU-8 5 182 and soft baked.

To assemble the probe array chip, the formed probe array film 144 is bonded (FIG. 13D) to the glass holder 116. This preferably is done by placing the two in contact with the probes 112 and the counter electrodes 114 aligned. The probe chip 130 is heated to 70-80° C. to allow the uncured SU-8 182 on the glass holder 116 to reflow within a region 186 and wet the cured SU-8 insulator 174 on the probe array film 144. This creates a temporary joint when the probe chip 130 is cooled. The joint is made permanent by exposing the reflow region 186 to UV light 188 through the glass holder 116 (through a mask 190) and heating it to crosslink the uncured SU-8. The remaining unexposed SU-8 is then removed with SU-8 developer (e.g., MicroChem).

The probe array 142 is then released from the silicon chip 160 (FIG. 13E) by etching the zinc oxide sacrificial layer 164 between the probe array film 144 and the silicon die. After release, the gold electrode layer 172 on the probe array film 144 is connected to the ground electrode 146 at the rear of the array 142 by manually applying the carbon conducting paste 128.

A suitable operating voltage for the probe array chip 130 may allow, for example, deflection near half of the electrode gap (see FIG. 12) between the probe 112 and the counter electrode 114 without creating snap-in. In general, parallel-plate electrostatic actuators produce most of their deflection near the snap-in voltage. Near this point, the cantilever position of the probes 112 is very sensitive to nuances in the mechanical and electrostatic state of the system. However, the entire array can be used at slightly lower voltages. In an exemplary embodiment, a safe operating voltage of 190V is used for lithography operations, though the voltage may be lower in some cases (for example, to prevent tip release during lithography).

Experiments were performed by the present inventors using electrostatically actuated probe array chips at the 190V operating voltage. The present inventors found that cross-talk magnitude could be made approximately equal to the cross-talk in thermally-actuated arrays, but with significantly reduced array pitch. Actuator cross-talk may be reduced, for example, by depressing the probe array against the substrate after first contact.

ODT patterns were written on an electrically grounded surface, which included a polished silicon substrate with a 5 nm chromium layer and a 20 nm gold layer deposited by thermal evaporation. The probe array may be vapor coated (e.g., see S. Hong, J. Zhu, and C. A. Mirkin, "Multiple Ink Nanolithography: Toward a Multiple-Pen Nano-Plotter," *Science*, vol. 286, pp. 523-5, 1999) or immersion coated (e.g., see L. M. Demers and C. A. Mirkin, "Combinatorial templates generated by dip-pen nanolithography for the formation of two-dimensional particle arrays," *Angew. Chem. Int. Ed.*, vol. 40, pp. 3069-71, 2001). Both single-probe actuation and differential actuation in a probe array were tested. The narrowest line width of lines drawn compared favorably to results obtained with commercial silicon nitride, contact mode cantilevers.

As another benefit, as the DPN process is improved and feature sizes are reduced, greater resolution and accuracy are desirable for the positioning device for the array chip 130. For example, for an AFM scanner, because the digital controller's resolution is generally fixed, such greater resolution and accuracy typically is obtained by limiting the scanner's range of motion. To continue to connect adjacent probe patterns, the array pitch must also be reduced. The array pitch in the probe array chip 130 can be reduced compared to other electrostatically actuated chips.

Another reason to reduce the array pitch is to speed multi-ink patterning tasks. Previous efforts required several probe chips, each coated with a different ink, and a time-consuming process of sequentially installing and aligning each probe with the existing pattern. Multi-probe arrays can speed this process by placing several probe tips, each with a different ink, in close proximity to the pattern being constructed. If the array pitch is less than the scanner's range of motion, multiple tips can be maneuvered into the same region without the need to replace probe chips or write alignment markers.

Figure 14:
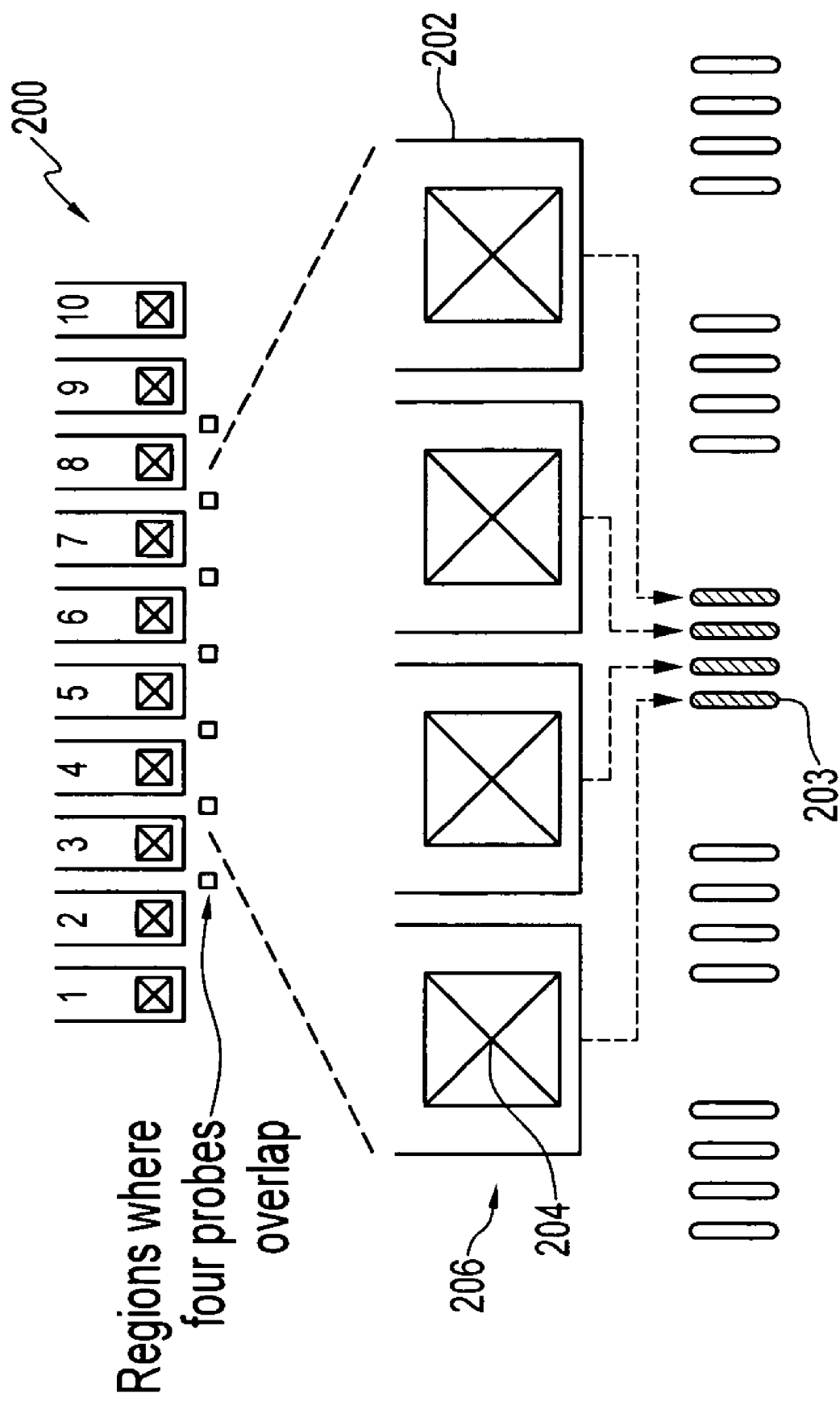
FIG. 14 shows an exemplary probe array for creating a multiple-ink pattern.

An exemplary probe array 200 for multiple ink patterning is shown in FIG. 14. The exemplary probes 202 have a 30 μm pitch and are installed on a 100 μm scanner. Because the array pitch is smaller than the maximum scanner deflection, some surface regions 203 are reachable by more than one probe. For example, in the probe array 200, there is a 10 μm wide region between each probe 202 that can be reached by the two closest tips 204 on either side. If each probe 202 is coated with a different ink, then each group 206 of four probes can work together to create a 4-ink pattern without the need for an intermediate alignment process. The concept has been demonstrated by simultaneously writing blocks of multi-probe patterns.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. An apparatus for applying a patterning compound in nanolithography, the apparatus comprising:
    a substrate comprising a surface for receiving the applied patterning compound;
    a cantilevered probe, said probe having a probe tip at a flexible end suitable for distributing a patterning compound onto the surface of the substrate when the probe tip is in sufficient proximity to the substrate, and having a probe electrode coupled to a voltage source;
    the substrate further comprising a counter-electrode to said electrode.

2. The apparatus of claim 1 wherein the probe electrode comprises a layer of conductive material.

3. The apparatus of claim 2 wherein the probe electrode is coupled to a selectively controllable voltage source.

4. The apparatus of claim 1 wherein the counter-electrode is coupled to a selectively controllable voltage source.

5. The apparatus of claim 1 wherein the counter-electrode comprises a layer of conductive material.

6. The apparatus of claim 5 wherein the counter-electrode is disposed over the substrate.

7. The apparatus of claim 6 wherein the counter-electrode comprises a layer of gold.

8. The apparatus of claim 6 wherein the counter-electrode is disposed on an outer surface of the substrate and receives the applied patterning compound.

9. The apparatus of claim 1 wherein said probe comprises silicon nitride.

10. The apparatus of claim 9 wherein the probe electrode comprises a surface layer of gold patterned over the silicon nitride.

11. The apparatus of claim 10 wherein said probe further comprises a layer of chromium disposed between the surface layer of gold and the silicon nitride.

12. The probe of claim 1 wherein the probe electrode is completely disposed within lateral edges of said probe.

13. The probe of claim 1 wherein selective actuation moves the probe tip to a position in sufficient proximity to the substrate to permit patterning of the patterning compound.

14. An apparatus for applying a patterning compound to a substrate for nanolithography, the probe chip comprising:
    a probe chip comprising a plurality of cantilevered probes, each of the plurality of probes having a flexible end including a probe tip for applying the patterning compound to the substrate;
    each of the plurality of probes further comprising a probe electrode coupled to a selectively controllable voltage source, the selectively controllable voltage source applying a voltage to the probe electrode to deflect the probe;
    a substrate for receiving the applied patterning compound, said substrate including a counter-electrode for one or more of the probe electrodes.

15. The apparatus of claim 14 wherein the plurality of probes are arranged parallel to one another.

16. The apparatus of claim 14 wherein the plurality of probes are anchored to said probe chip at an end opposite the flexible end.

17. The apparatus of claim 16 wherein said probe chip comprises etched silicon.

18. The apparatus of claim 17 wherein the plurality of probes comprises silicon nitride formed on silicon.

19. The apparatus of claim 14 wherein each of the plurality of probes is about 10 microns wide and 100 microns long.

20. An apparatus for applying a patterning compound for nanolithography, the apparatus comprising:
    a holder;
    an array of flexible cantilevered probes anchored to said holder, each of said probes including a tip and a layer of conductive film providing a probe electrode; and
    said holder including an array of counter electrodes disposed to face each of the probe electrodes, respectively, the counter electrodes being electrically actuable to provide an electrostatic attractive force between said probes and the probe electrodes to flex said probe and lift the tips of said probes.

21. The apparatus of claim 20 wherein said array of cantilevered probes each comprise the layer of conductive film, a layer of stress-free silicon nitride, and a layer of tensile silicon nitride.

22. The apparatus of claim 21 wherein the layer of tensile silicon nitride is disposed at a bottom surface of the probe along with the tip.

23. The apparatus of claim 21 wherein the layer of conductive film comprises gold, and wherein said array of cantilevered probes further comprise a layer of chromium disposed between the layer of gold and the layer of stress-free silicon nitride.

24. The apparatus of claim 20 wherein each of the probe electrodes are electrically connected to ground, and wherein each of said counter electrodes are electrically connected to a selectively operable voltage source.

25. The apparatus of claim 24 wherein each of the probe electrodes are separated from the counter electrodes by an insulator.

26. The apparatus of claim 24 wherein each of the probe electrodes are formed as part of a film array stack that is separated from the counter electrodes by an insulator and electrically connected to ground.

27. The apparatus of claim 26 wherein the film array stack is electrically connected to a ground pad via a carbon conductive paste.

28. The apparatus of claim 24 wherein each of the probe electrodes are electrically connected to the voltage source via an actuator trace disposed on the holder.

29. The apparatus of claim 28 further comprising:
a plurality of ground traces disposed on the holder and respectively between each of said actuator traces, said plurality of ground traces being electrically connected to ground.

30. The apparatus of claim 20 wherein said holder comprises glass.

31. The apparatus of claim 20 wherein said counter electrodes extend to a point short of the tip of each of said array of probes.

32. The apparatus of claim 20 further comprising:
an actuator for manipulating said holder over a substrate in directions parallel to the substrate.

33. The apparatus of claim 32 wherein the array pitch of said array of probes is less than the maximum deflection for said actuator.

34. The apparatus of claim 33 wherein tips of at least two of said array of probes are coated with a different ink.

* * * * *